United States Patent [19]
Gilmer et al.

[11] Patent Number: 5,851,307
[45] Date of Patent: Dec. 22, 1998

[54] METHOD FOR IN-SITU CLEANING OF POLYSILICON-COATED QUARTZ FURNACES

[75] Inventors: Mark C. Gilmer, Austin; Mark I. Gardner, Cedar Creek; Robert Paiz, Austin, all of Tex.

[73] Assignee: Advanced Micro Devices, Inc.

[21] Appl. No.: 842,092

[22] Filed: Apr. 28, 1997

[51] Int. Cl.$^6$ ........................................................ B08B 9/00
[52] U.S. Cl. .......................... 134/22.1; 134/3; 134/22.18; 134/42; 438/905
[58] Field of Search ........................... 134/22.1, 3, 22.11, 134/22.16, 22.17, 22.18, 42; 438/905

[56] References Cited

U.S. PATENT DOCUMENTS

| | | | |
|---|---|---|---|
| 5,294,262 | 3/1994 | Nishimura | 134/22.1 |
| 5,380,370 | 1/1995 | Niino et al. | 134/22.11 |
| 5,637,153 | 6/1997 | Niino et al. | 134/22.11 |
| 5,679,215 | 10/1997 | Barnes | 134/1.1 X |

*Primary Examiner*—Jill Warden
*Assistant Examiner*—Saeed Chaudhry
*Attorney, Agent, or Firm*—Kevin L. Daffer; Conley, Rose & Tayon

[57] ABSTRACT

A method for in-situ cleaning of polysilicon-coated quartz furnaces are presented. Traditionally, disassembling and reassembling the furnace is required to clean the quartz. This procedure requires approximately four days of down time which can be very costly for a company. In addition, cleaning the quartz requires large baths filled with a cleaning agent. These baths occupy a large amount of laboratory space and require a large amount of the cleaning agent. Cleaning the furnace in-situ eliminates the very time consuming procedure of assembling and disassembling the furnace and at the same time requires less laboratory space and less amount of cleaning agent. The polysilicon remover may be either a mixture of hydrofluoric and nitric acid or TMAH. TMAH is preferred because it less hazardous than hydrofluoric acid and compatible with more materials. The cleaning agent may be introduced into the furnace either from the built-in injectors or from additionally installed injectors. If the built-in injectors are used, the input system of the furnace is cleaned in addition to the quartz inner lining.

8 Claims, 4 Drawing Sheets

HF

| | |
|---|---|
| Health | -4 Extreme (poison) |
| Flammability | -0 None |
| Reactivity | -2 Moderate |
| Contact | -4 Extreme (corrosive) |

TMAH

| | |
|---|---|
| Health | -2 Moderate |
| Flammability | -0 None |
| Reactivity | -0 None |
| Contact | -3 Severe (corrosive) |

FIG. 4

| | TMAH | HF |
|---|---|---|
| Metals | | |
| Stainless steel | Yes | No |
| Copper | No | No |
| Nickel | Yes | No |
| Elastomers | | |
| EPDM | Yes | Yes |
| Kalrez | Yes | Yes |
| Viton | Yes | No |
| Buna -N | No | No |
| Polymers | | |
| Tefzel | Yes | Yes |
| PVDF | No | No |
| PVC | No | No |
| PTFE | Yes | Yes |
| FEP | Yes | Yes |
| PFA | Yes | Yes |
| PP | Yes | No |
| PE | Yes | No |
| Halar | Yes | Yes |

FIG. 5

METHOD FOR IN-SITU CLEANING OF POLYSILICON-COATED QUARTZ FURNACES

BACKGROUND OF THE INVENTION

1. Field of the Invention

This invention relates to semiconductor processing and, more particularly, to a method for in-situ cleaning of a quartz furnace used for the deposition of poly-crystalline silicon upon a wafer topography.

2. Description of Relevant Art

Fabrication of a field-effect transistor ("FET") is well-known. The manufacturing process begins by lightly doping a single crystal silicon substrate. The active areas where the transistors or other devices will be formed are then isolated from other active areas on the substrate using isolation structures formed in the field regions. A gate dielectric is formed in the active regions, preferably by thermally oxidizing the silicon substrate. Subsequently, a gate conductor is patterned upon the gate dielectric. Source and drain regions are laterally displaced on either side of the gate conductor. A channel region between the source and the drain is protected from the implant species by the pre-existing gate structure. When voltage above a certain threshold is applied to the gate of an enhancement-mode transistor, the channel between the source and drain becomes conductive and the transistor turns on.

The original FETs used metal to form the conductive gate structures which gave rise to the name metal-oxide-semiconductor ("MOS"). However, poly-crystalline silicon ("polysilicon") has taken the place of metal as the preferred gate conductor material. Metal processing tends to be "dirty" resulting in contamination of the substrate with unstable threshold voltages. Furthermore, metals typically have a relatively low melting point which restricts the processing temperatures subsequent to metal deposition. Polysilicon has a higher melting point and can permit higher temperatures to be used subsequent to deposition.

Polysilicon is typically blanket-deposited upon the wafer and then patterned to form the gate conductive structure using conventional photolithography. Chemical vapor deposition ("CVD") is the preferred method of depositing polysilicon. Vapor phase chemicals that contain the required constituents react together to form a solid film. CVD can be performed in special reactors which are held at atmospheric pressure. For the deposition of polysilicon, low-pressure CVD ("LPCVD") reactors are preferred over the earlier atmospheric pressure CVD reactors. LPCVD reactors offer better step coverage, less particulate contamination, and excellent uniformity.

An example of a vertical flow LPCVD reactor is shown in FIG. 1. Quartz 10 is the preferred material used to form the inner lining of the furnace chamber due to its purity and high temperature rating. Heaters 12, which are between housing 13 and quartz 10, help maintain the furnace chamber ambient at a particular temperature. Typically, 500°–700° C. is the preferred temperature used for the deposition of polysilicon. Wafers 14 are placed inside a carrier, often referred to as a "boat". Boat 16 is then placed vertically inside the furnace chamber. Vapor phase chemicals enter the furnace chamber through input port 18, which thereafter directs the chemicals toward wafers 14 using injectors 20. Silane or dichlorosilane are typically injected into the furnace chamber. Upon entering the furnace chamber, the gases decompose to produce polysilicon. Reaction byproducts exit the furnace chamber through output manifold 22. Manifold 22 is connected to a vacuum pump which maintains a low pressure, for example, 0.25–2.0 torr inside the chamber.

Polysilicon is not only deposited upon wafers 14 but, unfortunately, also upon quartz inner lining 10. After substantial use of the furnace, a thick film of polysilicon layer 24 accumulates on the quartz inner lining. Polysilicon layer 24 becomes an increasing source for contaminants which can cause defects upon wafers 14. Therefore, after approximately 100 hours of operation, quartz inner lining 10 needs to be replaced. The process requires disassembling/reassembling the furnace which is time consuming and results in several days of down-time. In addition to the costs associated with the down-time, there is substantial cost associated with replacing the quartz and recalibrating the furnace.

An alternative to replacing the quartz inner lining is to remove the accumulated polysilicon coating therefrom. Removal of the polysilicon can be achieved with a 1:1 solution of hydrofluoric and nitric acid. The nitric acid first reacts with the polysilicon to oxidize it and produce silicon oxide. The silicon oxide is then removed by the hydrofluoric acid. Cleaning of the quartz can be accomplished every 80–100 runs of the equipment which takes approximately 2–3 weeks. The furnace must be disassembled in order to remove the polysilicon-coated quartz which is then placed into a bath of the acid mixture. The chemical reactions release heat which can cause devitrification of the quartz and render it unusable. This is especially the case when a thick film of the polysilicon is to be removed. Frequent cleaning is thus necessary. The above cleaning process requires a large amount, typically 200 gallons, of the nitric-hydrofluoric acid mixture. In addition, the method requires a substantially large area for disassembling the equipment and for cleaning the quartz.

It would thus be desirable to have a method that does not require disassembling and then reassembling the furnace for the purpose of cleaning the quartz inner lining. Avoiding this would dramatically reduce the amount of very costly equipment down-time.

SUMMARY OF THE INVENTION

The problems identified above are in large part addressed by an in-situ cleaning method of the polysilicon-coated, quartz furnaces. In-situ cleaning does not require time consumptive disassembly and reassembly of furnace. Cleaning in-situ (i.e., without disassembly of the furnace) requires less time and effort, and therefore the quartz may be cleaned more often which can extend the life of the quartz and/or furnace. A large amount of space for a tub and liquid associated with the tub, is no longer needed. In-situ cleaning requires no extra space and requires less volume of the cleaning agent. The input system to the furnace chamber, which includes the input manifold and the built-in injectors, are also in-situ cleaned concurrent with cleaning of the quartz lining. The input system can be an additional source of contaminants that can cause defects on the wafers.

Broadly speaking, the present invention contemplates a method for in-situ cleaning of an assembled furnace. The furnace comprises a quartz inner lining which is coated with polysilicon. A cleaning agent is then introduced into the chamber.

In a first embodiment, the bottom door of the furnace is removed and replaced with a door that has a injector in its center. The furnace chamber is kept at a temperature of approximately 40°–200° C. by the heater coil surrounding the furnace chamber. A manifold connected to a source of polysilicon removal agent ("polysilicon remover") is then attached to the injector. The polysilicon remover is then sprayed through the injector at an upper surface of the quartz inner lining such that the polysilicon remover distributes itself over an entire surface of the quartz. The chamber is maintained at atmospheric pressure using the attached vacuum pump which is also responsible for removing any byproducts and unreacted polysilicon remover from the chamber. Tetramethylammonium hydroxide (TMAH) is preferably used, however, a mixture of hydrofluoric and nitric acid might also be used as the polysilicon remover.

In a second embodiment, a bubbler is connected to the input manifold of the chamber. The bubbler mixes together the liquid polysilicon remover with a carrier gas to convert the polysilicon remover to a gas state, a vapor state, or as a liquid-entrained carrier gas. The carrier gas can be either nitrogen or argon. The polysilicon remover/gas mixture is then introduced into the furnace chamber using the built-in injectors. The chamber is again maintained at atmospheric pressure. As a result, upon entry, the polysilicon remover/gas mixture distributes itself about the furnace chamber and reacts with the polysilicon coating. The byproducts and the unreacted polysilicon remover are extracted from the chamber using the vacuum pump connected to the output manifold of the chamber.

The present invention further contemplates an apparatus for in-situ cleaning of an assembled polysilicon-coated quartz furnace. Polysilicon remover is introduced into the chamber and allowed to react with the polysilicon-coating. An output manifold connected to a vacuum pump is responsible for removing any byproducts of the chemical reaction from the chamber and for maintaining the chamber at a low pressure. The chamber is maintained at atmospheric pressure.

In one embodiment, the polysilicon remover may be introduced into the chamber through an injector which is installed in the center of a door attachable to the bottom of the chamber. The polysilicon remover is sprayed to an upper surface of the quartz and then distributes downward across the chamber sidewalls. In a second embodiment, the polysilicon remover may be introduced into the chamber through an input manifold and a plurality of built-in injectors. The polysilicon remover is carried within (i.e., is mixed with the carrier gas).

BRIEF DESCRIPTION OF THE DRAWINGS

Other objects and advantages of the invention will become apparent upon reading the following detailed description and upon reference to the accompanying drawings in which:

FIG. 4 shows a table comparing the detriments of using hydrofluoric acid and TMAH;

FIG. 5 shows a table comparing the material compatibility of hydrofluoric acid and TMAH.

Figure 1:
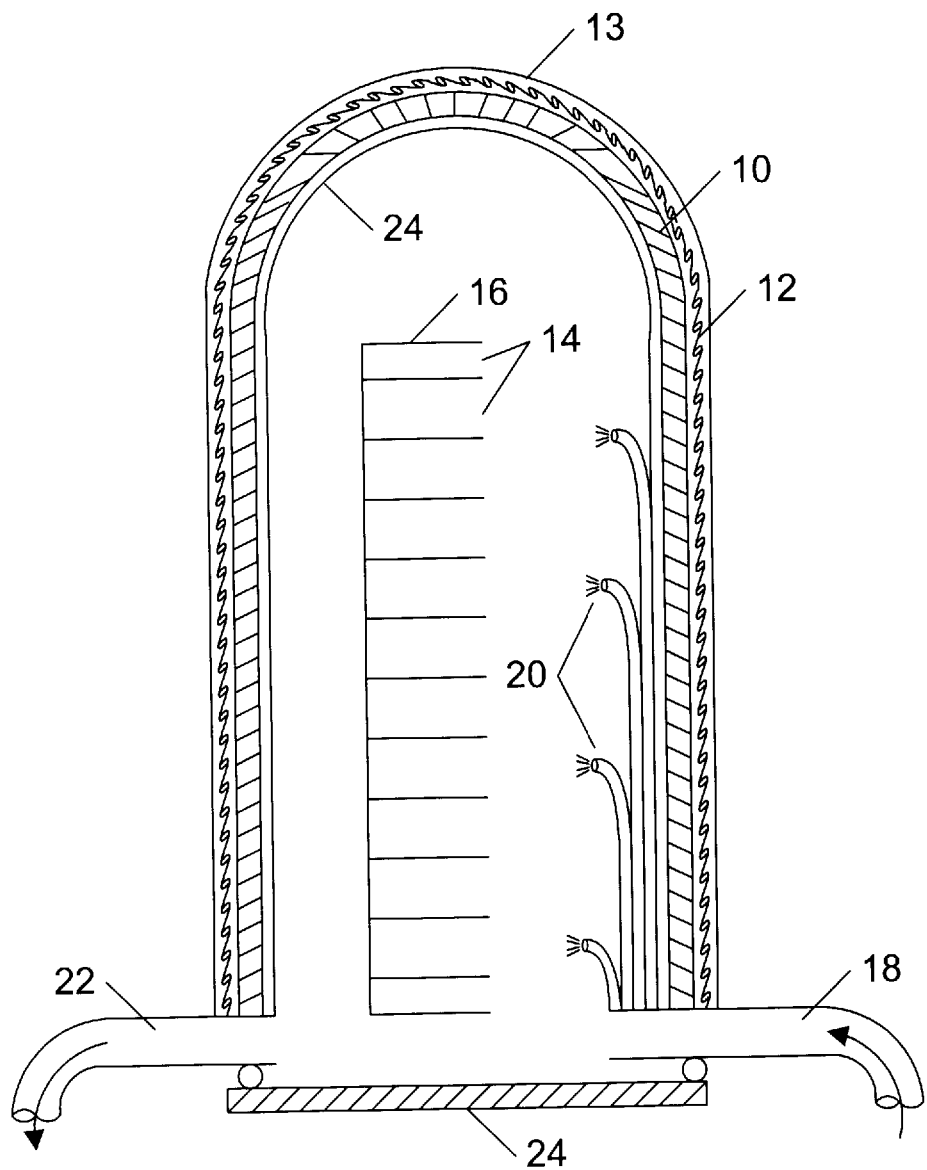
FIG. 1 is cross-sectional view of a quartz LPCVD furnace used for the deposition of polysilicon upon silicon wafers.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 2:
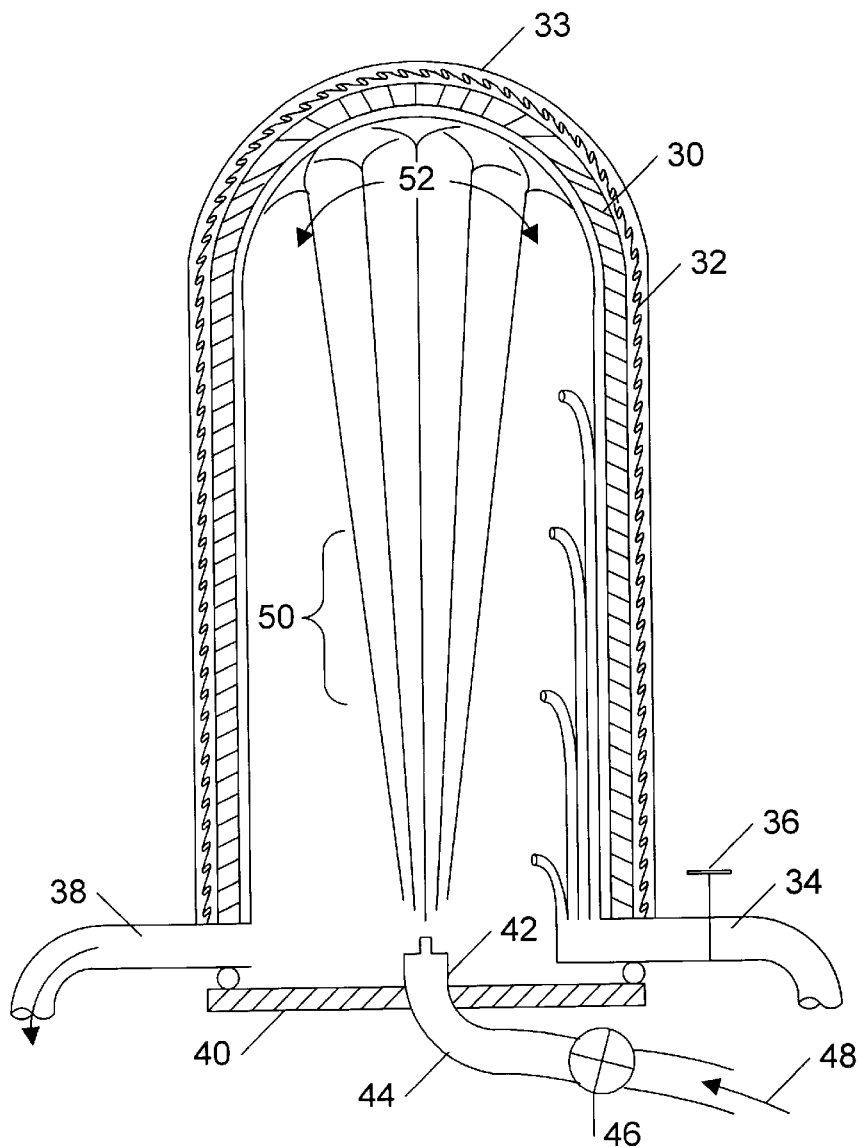
FIG. 2 is a cross-sectional view of a quartz LPCVD furnace showing a method for in-situ cleaning of the chamber according to a first embodiment of the invention.
Figure 3:
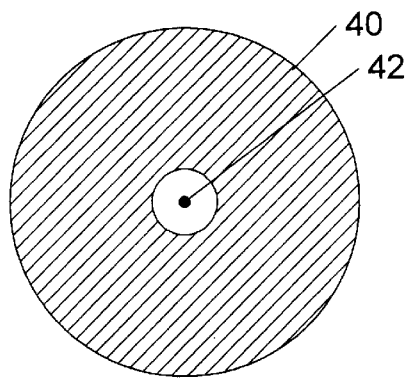
FIG. 3 is a top view of a door attachable to a bottom surface of the furnace chamber, wherein the door includes a port through which an injector is inserted to spray polysilicon remover on the upper surface of the quartz.

Turning now to the figures, FIG. 2 shows an apparatus for in-situ cleaning of the polysilicon-coated quartz furnace. The furnace comprises a chamber with quartz inner lining 30 surrounding a substantial portion of the chamber. Heater 32 encompasses the furnace chamber adjacent lining 30. Heaters 32 comprise a coil which maintains the furnace chamber at a pre-defined temperature. The flow from input manifold 34 is terminated (according to one embodiment) and valve 36 is closed to ensure that no gases or liquids flow in or out of the chamber. Output manifold 38 is connected to a vacuum pump which maintains a low pressure inside the chamber. In addition, any byproducts of the cleaning process are removed from the chamber through output manifold 38. A uniquely defined chamber door 40 replaces the original chamber door. Injector 42 is located near the center of door 40 with manifold 44 attached to an opening through door 40. FIG. 3 provides a more detailed, top view of door 40. The furnace door 40 can be securably applied and sealed against a lower surface of the chamber. Door 40 includes a receptor aperture dimensioned to sealingly engage an outer diameter of injector 42. The receptor is originally closed using a cap in order to maintain the low pressure inside the chamber. When cleaning is required, the cap is removed and the injector is inserted in the injector receptor. Pump 46 is then connected to the injector through manifold 44 on one end and to a supply of polysilicon remover at the other end.

In one embodiment, removal of polysilicon from the quartz chamber walls is accomplished by a mixture of hydrofluoric and nitric acid. The nitric acid reacts with and oxidizes the polysilicon to produce silicon dioxide. The silicon dioxide is subsequently removed by the hydrofluoric acid. The chemical reactions for the removal of the polysilicon generate a considerable amount of heat which can devitrify the quartz. Furthermore, hydrofluoric acid can be hard to handle since it can be easily absorbed through the skin. If hydrofluoric acid is used in conjunction with nitric acid, toxic oxides of nitrogen may be released when the mixture comes in contact with silicon. TMAH is a hazardous chemical but the hazards can be avoided through the use of personal protective equipment. FIG. 4 shows a table comparing the hazards of hydrofluoric acid and TMAH.

TMAH is generally compatible with more materials than hydrofluoric acid. A table showing the material compatibility of TMAH and hydrofluoric acid is shown in FIG. 5. Material compatibility is not as important when cleaning the quartz in baths, since the quartz can be separated from most other chamber materials. However, material compatibility is very important for in-situ cleaning since the whole chamber, and particularly metal components, is exposed to the polysilicon remover.

Referring again to FIGS. 2 and 3, injector 42 creates spray 50 of the polysilicon remover in such a way as to contact the chamber-facing surface of quartz lining 30 in dome-shaped area 52. The polysilicon remover subsequently drains down the polysilicon-coated quartz sidewalls to contact all of the polysilicon coating. If TMAH is used as the polysilicon remover, the chamber is maintained at approximately 40°–200° C. using chamber heaters 32. TMAH needs to be at least at 40° C. before it can react with and remove the polysilicon. The unreacted TMAH and byproducts of the reaction are removed from the chamber through output manifold 38.

Figure 6:
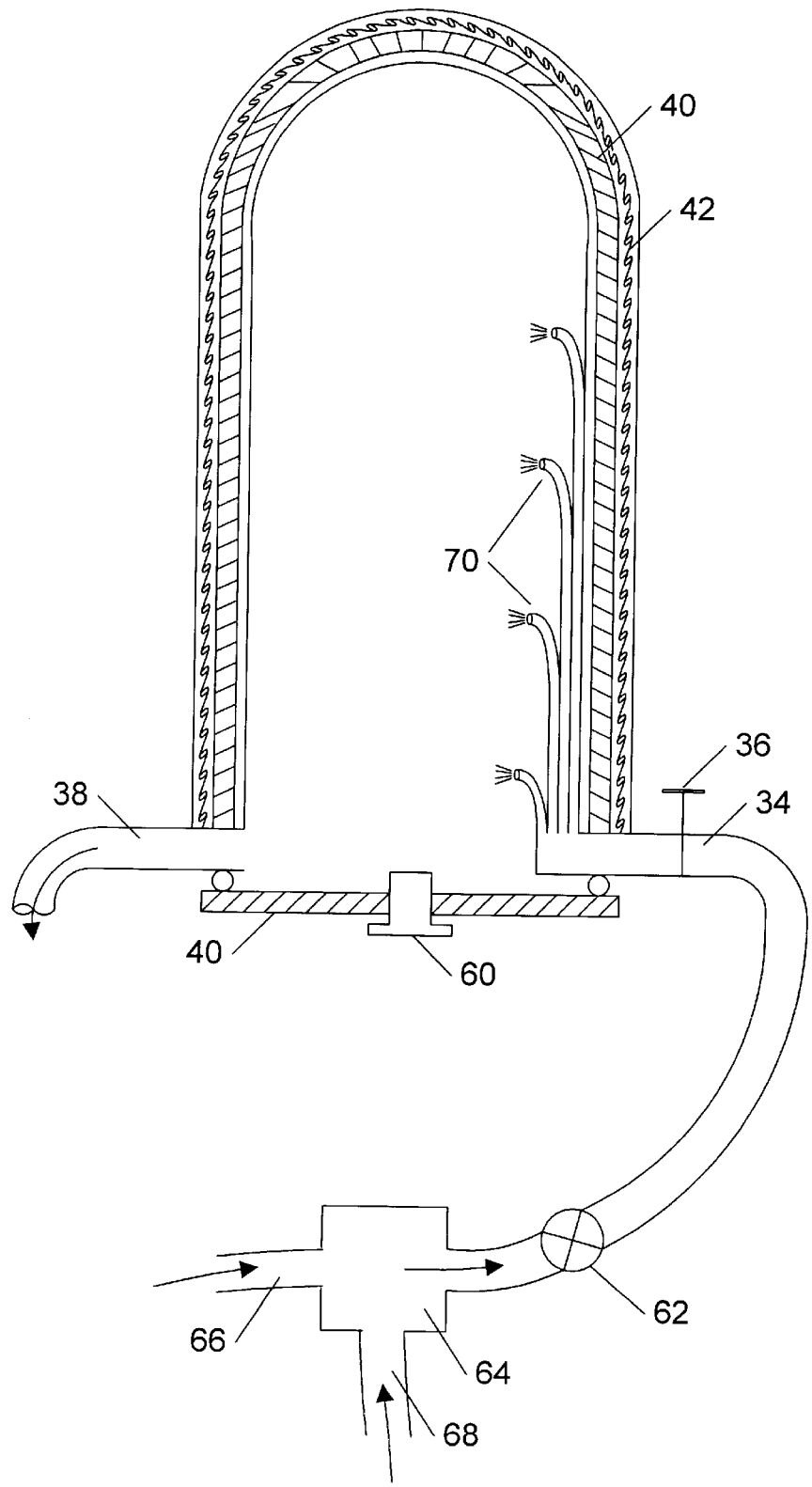
FIG. 6 is a cross-sectional view of a quartz LPCVD furnace showing a method for in-situ cleaning of the furnace chamber according to a second embodiment of the invention.

Turning now to FIG. 6, an alternative embodiment of the invention is shown. Cap 60 remains in sealed engagement with the aperture within door 40 to maintain the chamber vacuum pressure. Input valve 36 is now in the open position. Input manifold 34 is connected to pump 62 which in-turn is connected to bubbler 64. Polysilicon remover in liquid form is introduced into input manifold 66 of bubbler 64 and a carrier gas is introduced into input manifold 68. For the same reasons as above, the polysilicon remover is preferably TMAH. Nitrogen or argon are preferably used as carrier gases. The carrier gas mixes with the polysilicon remover inside bubbler 64 and then carries the polysilicon remover into the chamber in gas form. The gas mixture is introduced into the chamber through built-in injectors 70, the same injectors that are used to introduce polysilicon (or the chemicals that produce the polysilicon) into the chamber. Upon entry, the polysilicon remover, which is in gas form, distributes itself over the whole volume of the chamber due to the low pressure conditions inside the chamber. If TMAH is used as the polysilicon remover, the chamber is maintained at approximately 40°–200° C. using chamber heaters 32. Any byproducts and unreacted gases are removed from the chamber through output manifold 38. Output manifold 38 is connected to a vacuum pump which is also responsible for maintaining a low pressure inside the chamber.

In addition to removing polysilicon from the quartz inner lining of the furnace, this method is also capable of cleaning the input system of manifold 34 and injectors 70. Polysilicon deposits inside the input system, in addition to deposits upon the quartz, can be a source of impurities which can in turn cause defects upon the wafers that are treated inside the furnace.

It will be appreciated to those skilled in the art having the benefit of this disclosure that this invention is believed to be capable of in-situ cleaning of polysilicon-coated quartz furnaces. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method for cleaning a semiconductor processing tool, comprising:

providing said semiconductor processing tool comprising a chamber encompassed partially within a quartz lining;

removing a door from a lower surface of a housing which surrounds the quartz lining;

replacing said door with another door comprising an aperture having an inner diameter dimensioned to sealingly receive an outer diameter of an injector;

introducing a cleaning agent into said chamber in gaseous communication with said quartz lining without disassembling said processing tool; and removing cleaning byproducts from said chamber subsequent to said cleaning agent reacting with a film accumulated upon said quartz lining.

2. The method as recited in claim 1, further comprising maintaining the chamber at atmospheric pressure.

3. The method as recited in claim 1, wherein the step of introducing said cleaning agent comprises:

activating a heating coil interposed between the housing and the quartz lining to heat an ambient within the chamber to approximately 40°–200° C.; and delivering said cleaning agent through the injector, into the chamber, and across at least a potion of the quartz lining facing the chamber.

4. The method as recited in claim 3, wherein the step of delivering said cleaning agent comprises mixing said cleaning agent with a carrier gas in a bubbler.

5. The method as recited in claim 4, wherein said carrier gas comprises nitrogen or argon.

6. The method as recited in claim 3, wherein the step of delivering said cleaning agent comprises delivering said cleaning agent through a pre-existing injector.

7. The method as recited in claim 1, wherein the step of removing cleaning products comprises reacting said cleaning agent with a polysilicon film.

8. The method as recited in claim 1, wherein the step of introducing a cleaning agent comprises introducing a mixture of tetramethylammonium hydroxide and water or a mixture of hydrofluoric acid, nitric acid, and water.

* * * * *